United States Patent [19]
Hata et al.

[11] Patent Number: 5,439,837
[45] Date of Patent: Aug. 8, 1995

[54] METHOD OF FABRICATING A THIN-FILM TRANSISTOR HAVING AN OFFSET GATE STRUCTURE

[75] Inventors: Akihiro Hata, Tenri; Yasunori Shimada, Kashihara, both of Japan

[73] Assignee: Sharp Kabushiki Kaisha, Osaka, Japan

[21] Appl. No.: 359,192

[22] Filed: Dec. 19, 1994

[30]   Foreign Application Priority Data

Dec. 20, 1993 [JP]   Japan ................... 5-320135

[51] Int. Cl.⁶ .......................................... H01L 21/86
[52] U.S. Cl. .............................. 437/41; 437/21; 437/44; 437/229
[58] Field of Search ............ 437/41, 21, 44, 229, 437/913; 148/DIG. 150

[56]   References Cited

U.S. PATENT DOCUMENTS

| | | | |
|---|---|---|---|
| 5,137,841 | 8/1992 | Takeda et al. | 437/229 |
| 5,306,653 | 4/1994 | Hur | 437/229 |
| 5,362,661 | 11/1994 | Kim | 148/DIG. 150 |
| 5,385,854 | 1/1995 | Batra et al. | 437/27 |

FOREIGN PATENT DOCUMENTS

| | | | |
|---|---|---|---|
| 4-360580 | 12/1992 | Japan . | |
| 4-360581 | 12/1992 | Japan . | |
| 0582549 | 4/1993 | Japan | 437/41 |
| 5175230 | 7/1993 | Japan | 437/41 |
| 5182983 | 7/1993 | Japan | 437/21 |

Primary Examiner—Brian E. Hearn
Assistant Examiner—Michael Trinh
Attorney, Agent, or Firm—Nixon & Vanderhye

[57]   ABSTRACT

Using a gate electrode formed on a semiconductor film as a mask, impurity ions are implanted into the semiconductor film. Thereafter, a photoresist film is formed on the substrate including the gate electrode. The photoresist film on the gate electrode is then exposed to light from a back side of the gate electrode. By this self-alignment method, a resist pattern narrower than the gate electrode is formed. Then, the gate electrode is narrowed through the etching thereof using the photoresist pattern as a mask, whereby an offset gate structure of a thin-film transistor is obtained.

6 Claims, 13 Drawing Sheets

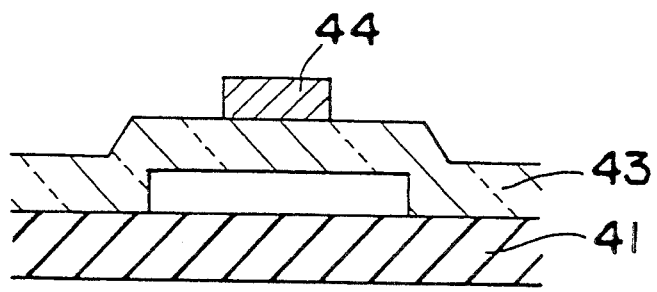
Fig. 7A
PRIOR ART
Fig. 7B
PRIOR ART
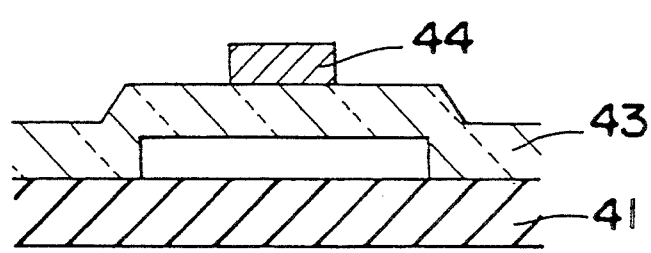
Fig. 7C
PRIOR ART
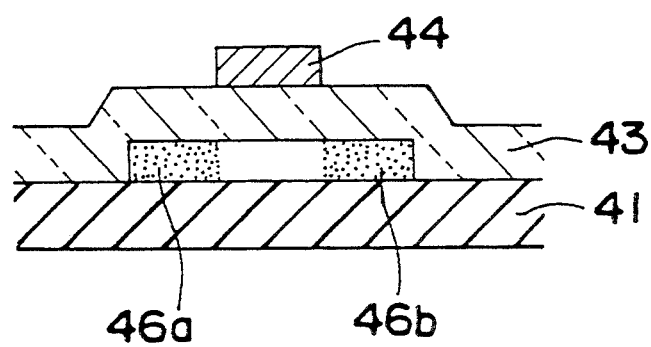
Fig. 7D
PRIOR ART
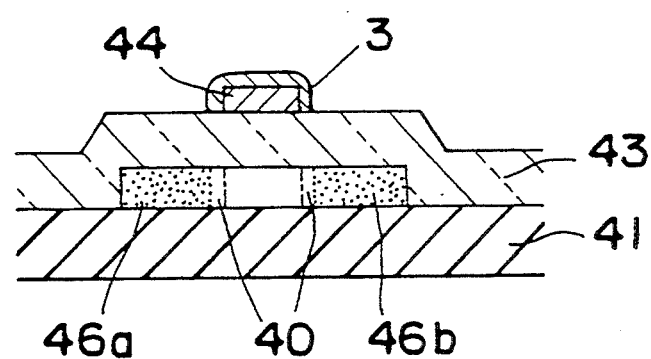

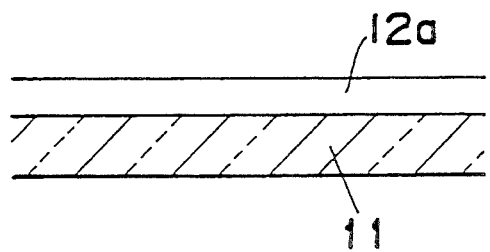
Fig. 10A
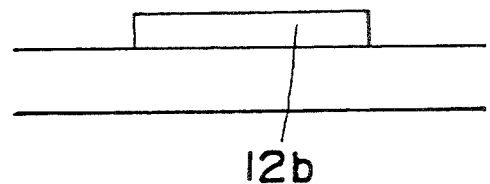
Fig. 10B
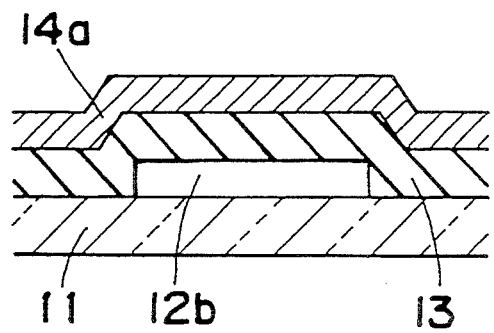
Fig. 10C
Fig. 10D
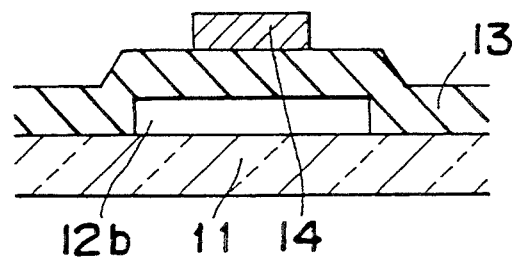
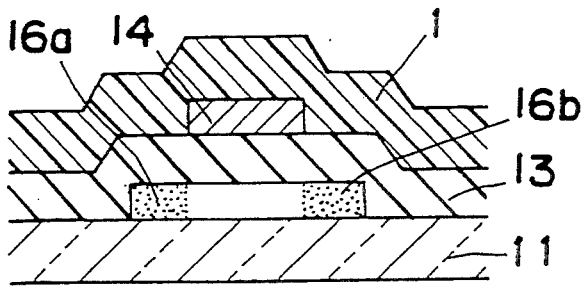
Fig. 10E

Fig. 11
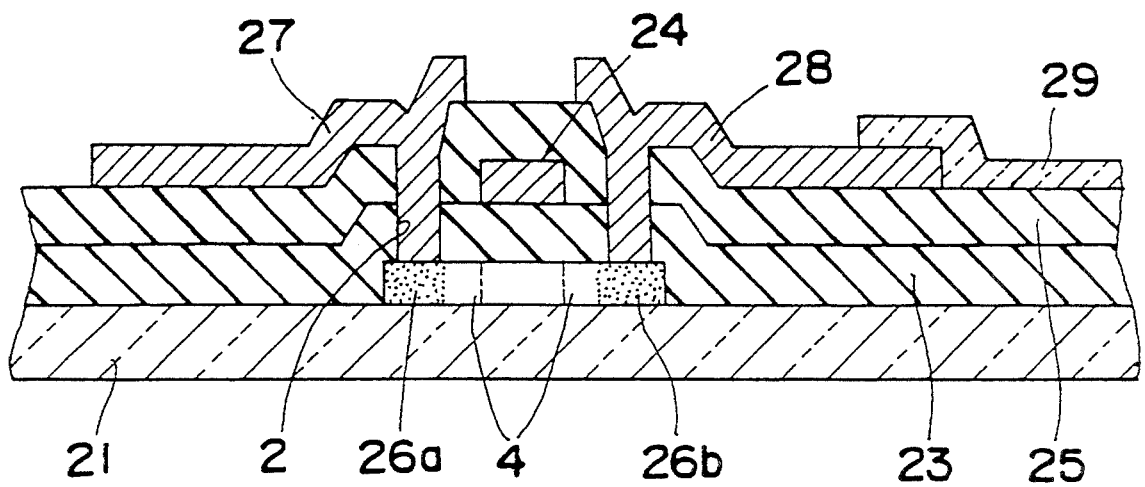
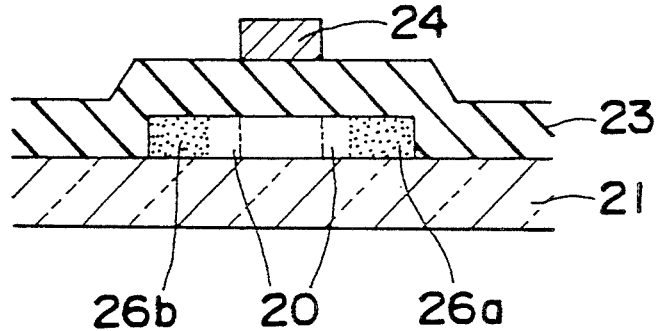
Fig. 12A
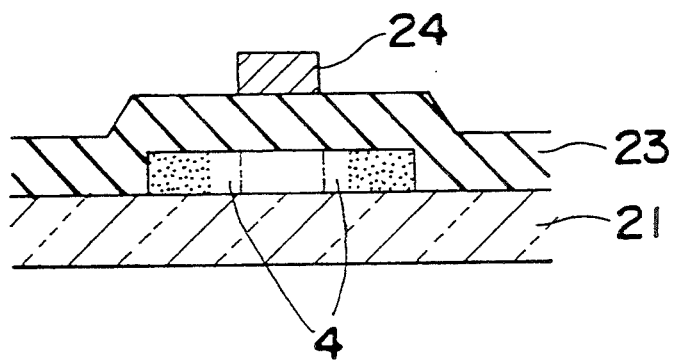
Fig. 12B

METHOD OF FABRICATING A THIN-FILM TRANSISTOR HAVING AN OFFSET GATE STRUCTURE

BACKGROUND OF THE INVENTION

1. Field of the Invention

The present invention generally relates to a thin-film transistor to be used to drive liquid crystals in an active matrix liquid crystal display (LCD) and more particularly, to a thin-film transistor having offset regions.

2. Description of the Prior Art

Thin-film transistors intended for application to planar display devices and other image display devices have been actively researched and developed these days. The thin-film transistors to be used in active matrix LCDs or other display devices are required to have characteristics such as high mobility, high ratio of the ON current to the OFF current, high resistance to electric voltage, and ability of reducing the device size.

Polycrystalline semiconductor thin-film transistors have merits of high performance and high reliability, but they also have a demerit that high temperatures are required in the film formation, when compared to transistors using an amorphous semiconductor film. Thus, there have been many researches and applications of techniques of crystallizing amorphous semiconductor films into polycrystalline semiconductor films through irradiation of laser and without using a high-temperature process.

FIG. 1 shows a sectional view of a conventional thin-film transistor using a polycrystalline semiconductor film and FIGS. 2A, 2B, 2C, 2D, 2E, 2F, 2G and 2H show steps of a fabrication process for the transistor shown in FIG. 1. The following describes the fabrication process with reference to these figures. First, an amorphous semiconductor (a-Si) film 62a is formed on a glass substrate 61 as shown in FIG. 2A. Then the amorphous semiconductor film 62a is patterned and partially irradiated with the excimer laser, so that part of the amorphous semiconductor film 62a is made to grow into a polycrystalline semiconductor (P-Si) film 62b and only that part is left as shown in FIG. 2B. Thereafter, a gate insulation film 63 and a metal film 64A are formed as shown in FIG. 2C. The metal film 64A is then patterned to become a gate electrode 64, and thereafter impurity ions are implanted into the polycrystalline film 62b, using the gate electrode 64 as a mask, as shown in FIG. 2D. As a result, a source region 66a and a drain region 66b are formed as shown in FIG. 2E. Subsequently, partial irradiation of the substrate with the excimer laser is performed to activate and thereby infuse the ions. Next, an interlayer insulation film 65 is formed and the simultaneous patterning of the interlayer insulation film 65 and the gate insulation film 63 is performed to form contact holes as shown in FIG. 2F. Thereafter, a metal film is formed and patterned into a source electrode 67 and a drain electrode 68 as shown in FIGS. 2G and 2H. Finally, a picture element electrode 69 having a specific pattern is formed of a transparent conductive film such as an indium tin oxide (ITO) film. In this way, the conventional thin-film transistor of FIG. 1 is completed.

In a thin-film transistor formed using a polycrystalline semiconductor film, the ON current has a comparatively large value. However, because a lot of trap levels exist in the polycrystalline semiconductor film, a comparatively large amount of OFF current flows via the trap levels, disadvantageously. This deteriorates the data retaining capability. Therefore, it has been an urgent necessity to suppress the OFF current to a small value.

In order to impart a high ratio of the ON current to the OFF current and a high resistance to voltage to a thin-film transistor, trials have been made to reduce the OFF current by providing an offset region between each of the source and drain electrodes and the gate electrode and thereby relieving concentration of the field in the P-N junction formed between the source region and the drain region.

FIG. 3A is a plan view of a conventional polycrystalline semiconductor thin-film transistor having an offset gate structure. FIG. 3B is a cross sectional view taken along line 3B—3B of FIG. 3A. FIGS. 4A, 4B, 4C, 4D, 4E, 4F, 4G, 4H and 4I show steps of a fabrication process of the thin-film transistor shown in FIGS. 3A and 3B. The following describes the fabrication process with reference to these figures. First, an amorphous semiconductor (a-Si) film 52a is formed on a glass substrate 51 as shown in FIG. 4A. Then the amorphous semiconductor film 52a is patterned and partially irradiated with the excimer laser, so that the amorphous semiconductor film 52a is made to grow into a polycrystalline semiconductor (P-Si) film 52b, as shown in FIG. 4B. Thereafter, a gate insulation film 53 and a metal film 54a are formed as shown in FIG. 4C. The metal film 54a is then patterned to be a gate electrode 54. Thereafter, an ion implantation mask is formed of a photoresist film 1 and then impurity ions are implanted into the polycrystalline semiconductor film 52b from above the photoresist film 1, as shown in FIGS. 4D and 4E. As a result, a source region 56a and a drain region 56b are formed as shown in FIG. 4F. By removing the photoresist film 1 serving as the ion implantation mask, offset regions 50 are obtained, as shown in FIG. 4F. Subsequently, partial irradiation of the excimer laser, etc. is performed to activate and thereby infuse the ions. Next, an interlayer insulation film 55 is formed. The interlayer insulation film 55 and the gate insulation film 53 are patterned together into a specified configuration so that contact holes 2 are formed, as shown in FIG. 4G. Thereafter, a metal film is formed and patterned into a source electrode 57 and a drain electrode 58, as shown in FIGS. 4H and 4I. Finally, a picture element electrode 59 having a specific pattern is formed of a transparent conductive film such as an ITO film. In this way, the conventional thin-film transistor having offset regions, i.e., an offset gate structure, of FIGS. 3A and 3B is completed.

The fabrication process shown in FIGS. 4A–4I, however, requires a photolithographic step to form a photoresist film serving as an impurity ion implantation mask. This causes increase of the production costs. Furthermore, the photoresist film is disadvantageously hardened during the ion implantation process, so that the film is hardly detached or removed. The production process has a further problem that because the ion implantation is performed using the photoresist film as a mask, it is difficult to control the offset regions. Without a high alignment accuracy for the photolithography, the offset regions as expected would not obtained.

To solve the above problems, other methods of fabricating a thin-film transistor were invented, which are disclosed in, for example, JP-A-4-360580 and JP-A-4-360581.

FIGS. 7A, 7B, 7C and 7D show steps of a fabrication process equivalent to the fabrication process disclosed in JP-A-4-360580, and FIG. 5 shows a cross sectional view of a thin-film transistor produced by the fabrication process. Steps up to a step of forming a metal film for formation of a gate electrode 44 are the same as the steps shown FIGS. 4A–4C. After such steps, the metal film is patterned into the gate electrode 44, as shown in FIG. 7A. Then, impurity ions are implanted using the gate electrode 44 as a mask as shown in FIG. 7B, and a source region 46a and a drain region 46b are thus formed as shown in FIG. 7C. Then, the ions are activated and infused by the irradiation of the excimer laser. Next, surfaces of the gate electrode 44 are subjected to an anodizing process into an anodized film 3. The gate electrode 44 is thereby narrowed, so that offset regions 40 are formed as shown in FIG. 7D. Thereafter, an interlayer insulation film 45 is formed and patterned along with the gate insulation film 43 so that contact holes 2 are formed. Then, a metal film is formed and patterned into a source electrode 47 and a drain electrode 48. Finally, by forming a transparent conductive film 49, the thin-film transistor having offset regions as shown in FIG. 5 is obtained.

FIGS. 8A, 8B, 8C, 8D and 8E show steps of a fabrication process equivalent to the fabrication process disclosed in JP-A-4-360581, and FIG. 6 shows a cross sectional view of a thin-film transistor produced by the fabrication process. Steps up to a step of forming a metal film for formation of a gate electrode 34 are the same as the steps shown FIGS. 4A–4C. After such steps, the metal film is patterned by photolithography into the gate electrode 34. A photoresist film 1 used for the patterning of the gate electrode 34 is left on the gate electrode 34 as it is, as shown in FIG. 8A. Then, impurity ions are implanted using both the gate electrode 34 and the photoresist film 1 as a mask as shown in FIG. 8B, so that a source region 36a and a drain region 36b are formed as shown in FIG. 8C. Next, the sides of the gate electrode 34 are removed by wet-etching, with the photoresist film 1 being left on the gate electrode, as shown in FIG. 8D. As a result, the gate electrode 34 is narrowed and thereby offset regions 30 are formed, as shown in FIG. 8E. After the photoresist film 1 is removed, the implanted ions are activated and infused by irradiating the substrate with the excimer laser. Thereafter, an interlayer insulation film 35 is formed and patterned along with the gate insulation film 33 so that contact holes are formed. Then, a metal film is formed and patterned into a source electrode 37 and a drain electrode 38. Finally, by forming a transparent conductive film 39, the thin-film transistor having offset regions as shown in FIG. 6 is obtained.

In the thin-film transistor of FIG. 5 wherein the offset regions are formed by the anodizing process, the film thickness of the anodized film has a limit. More specifically, to get a sufficient width of the offset region, the anodized film should have an increased film thickness. If the film thickness of the anodized film is increased, however, the film thickness of the gate electrode will decrease accordingly and the electric current cannot flow well. Furthermore, because the anodized film is formed not only on the sides of the gate electrode but also on the top surface thereof, the interlayer film will have an increased film thickness and therefore there is a strong possibility that disconnection of the source electrode and the drain electrode take place. Furthermore, because the offset regions are formed through anodization of the gate electrode, the gate electrode is limited in material.

On the other hand, the thin-film transistor fabrication process shown in FIGS. 8A–8E has a problem that the photoresist film, which is the impurity ion implantation mask, is hardened during the ion implantation process, so that it becomes impossible to remove the film, as in the thin-film transistor fabrication process shown in FIGS. 4A–4I. In addition, removal of the sides of the gate electrode by wet etching requires a high-level technique. Therefore, it is difficult to control the offset regions.

SUMMARY OF THE INVENTION

The present invention has been developed with a view to substantially solving the above described disadvantages and has for its essential object to provide a method of fabricating a transistor having an offset gate structure which can reduce the number of masks for the photolithography steps, which offers a high alignment accuracy and which provides an increased reliability to the resulting transistors.

In order to accomplish the above object, the present invention provides a method of fabricating a transistor having an offset gate structure wherein offset regions are formed between a gate electrode and a source region and between the gate electrode and a drain region, comprising the steps of:

forming a semiconductor film, a gate insulation film and a gate electrode in that order on a top surface of a substrate either formed of an insulating material or having an insulation film on a surface thereof;

doping impurity ions in the semiconductor film using the gate electrode as a mask and thereby forming a source region and a drain region in the semiconductor film;

forming a photoresist film on the gate electrode and gate insulation film;

exposing the photoresist film to light from a back side of the substrate to form a photoresist pattern of a width smaller than that of the gate electrode; and etching both side surfaces of the gate electrode using the photoresist pattern as a mask and thereby forming an offset region of a specified width between said gate electrode and each of the source and drain regions.

The width of the offset region can be controlled by controlling a light exposure time for the photoresist film, a development time for the photoresist film or an etching time for the gate electrode.

Furthermore, an LDD (Lightly Doped Drain) structure can be obtained by doping impurity ions in the semiconductor film at a concentration lower than a concentration of the impurity ions doped in the source and drain regions using the gate electrode as a mask after the step of forming the offset regions. Thus, stabilization of characteristics of the transistor can be realized.

Because the transistor fabrication method of the present invention uses the gate electrode as a mask in the impurity ion implantation for forming the source and drain regions, a photolithography step is not carried out when the source and drain regions are formed. On the other hand, when forming the photoresist pattern for use in etching the side surfaces of the gate electrode, photolithography is performed. However, patterning of the photoresist is performed using the gate electrode as a mask, it is not necessary to form a photolithography mask. As a result, the number of photolithography masks for use in patterning of the photoresist reduces by one, as compared with the conventional thin-film transistor fabrication method of FIGS. 4A–4I wherein a photoresist is used as an impurity ion implantation mask for forming the source and drain regions. Therefore, costs are reduced. Furthermore, because of non-use of a photoresist film as an ion implantation film, the method of the invention does not have the problem that the photoresist film is hardened and becomes unremovable.

Furthermore, the method of the present invention can control the width of the offset region as desired by regulating the back light exposure time, development time or gate etching time, a sufficient width of the offset region is obtained, unlike the conventional thin-film transistor fabrication method shown FIGS. 7A–7D wherein the offset regions are obtained by the anodizing process. In addition, because the offset regions are easily controlled, it is possible to fall the off current (Ioff) without raising the on current (Ion). Further, because the anodizing process is not used, the gate electrode is not limited in material.

Furthermore, because the transistor fabrication method of the present invention forms the photoresist pattern for used in narrowing the gate electrode by a self-alignment method utilizing the back light exposure, the offset regions can be formed with accuracy even in fine transistor structures and therefore the method is applicable to large-sized displays.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 7A, 7B, 7C, and 7D illustrate some steps of a fabrication process for the thin-film transistor of FIG. 5;

FIGS. 10A, 10B, 10C, 10D, 10E, 10F, 10G, 10H, 10I, and 10J illustrate respective steps of the fabrication process for the thin-film transistor of FIGS. 9A and 9B;

FIG. 11 is a cross sectional of a thin-film transistor having an offset gate structure fabricated by a fabrication process according to a second embodiment of the present invention;

FIGS. 12A and 12B illustrate some steps of the fabrication process for the thin-film transistor of FIG. 11.

DETAILED DESCRIPTION OF THE PREFERRED EMBODIMENTS

First embodiment

Figure 1:
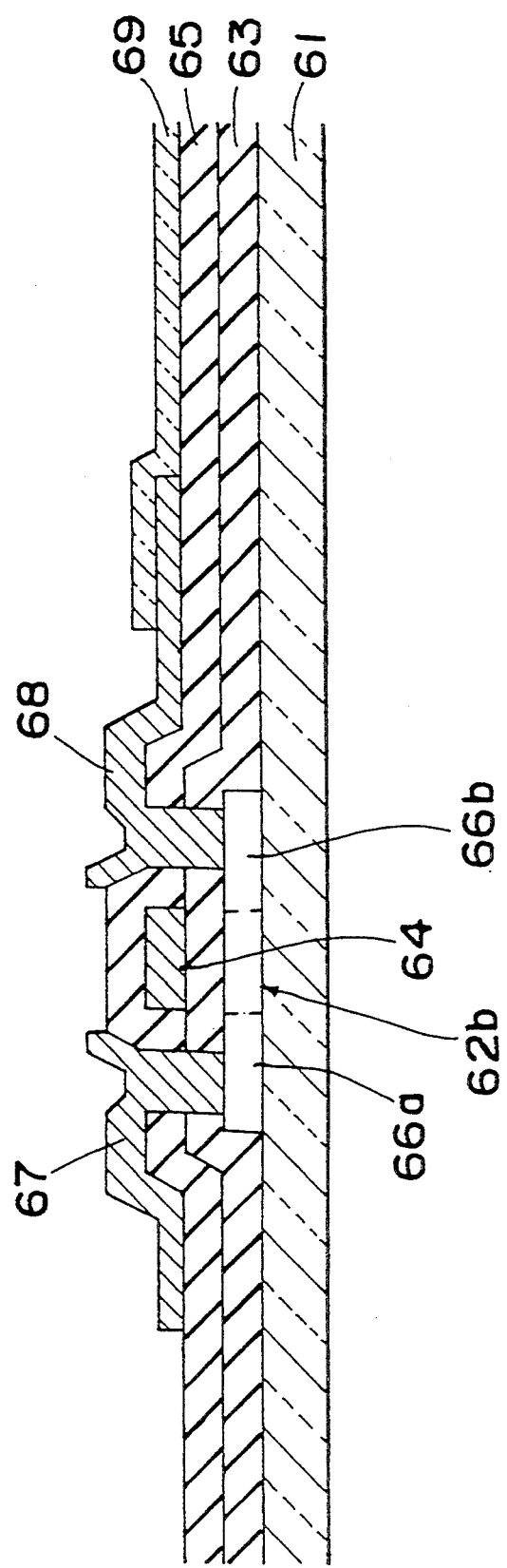
FIG. 1 is a cross sectional view of a conventional thin-film transistor.
Figure 2A:
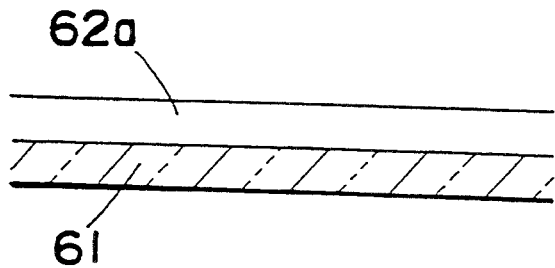
FIGS. 2A, 2B, 2C, 2D, 2E, 2F, 2G, and 2H illustrate respective steps of a fabrication process for the thin-film transistor of FIG. 1.
Figure 2B:
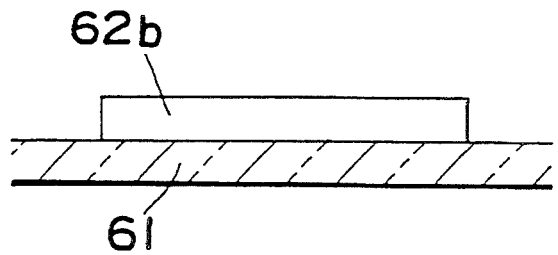
Figure 2C:
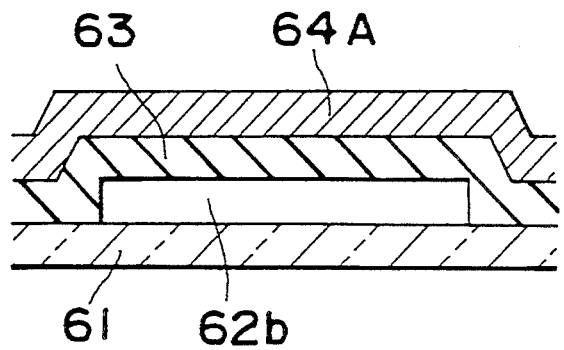
Figure 2D:
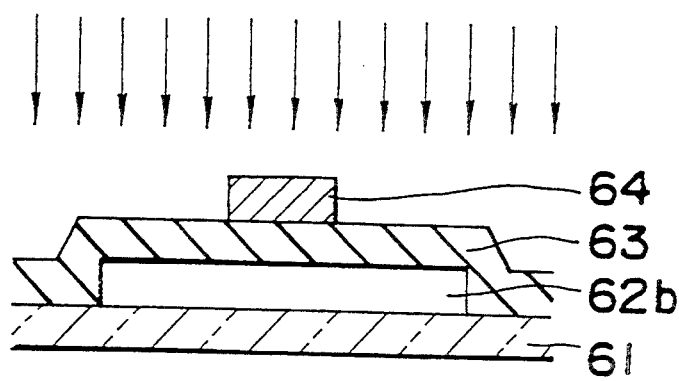
Figure 2E:
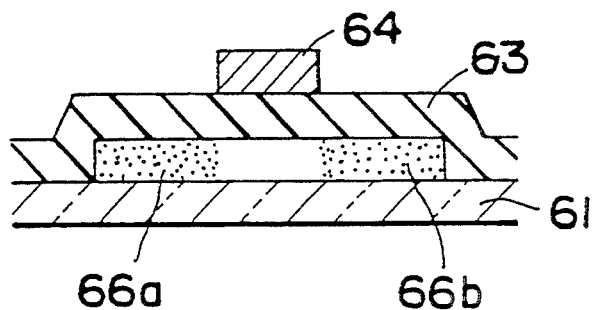
Figure 2F:
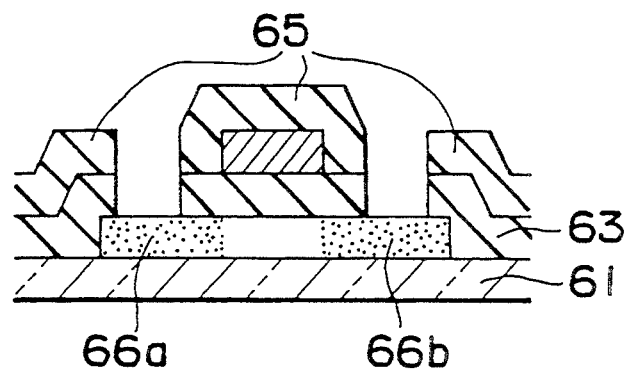
Figure 2G:
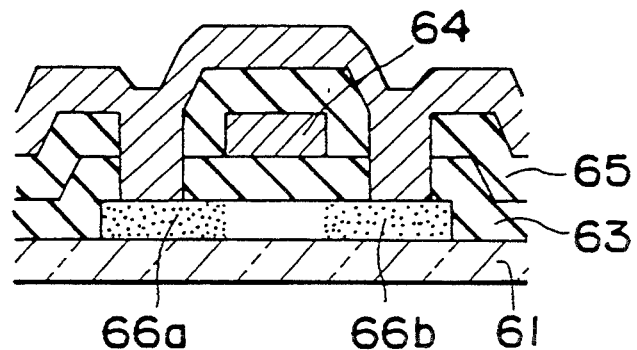
Figure 2H:
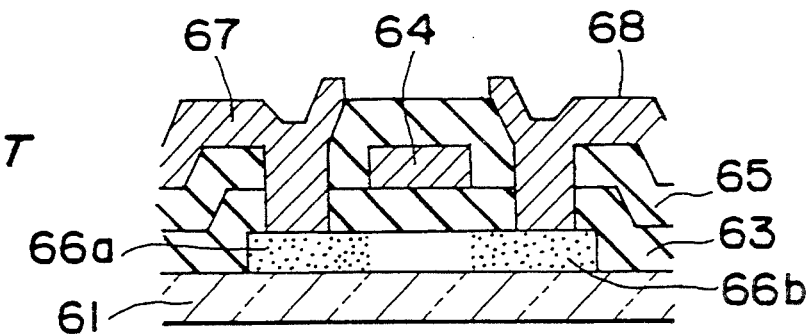
Figure 3A:
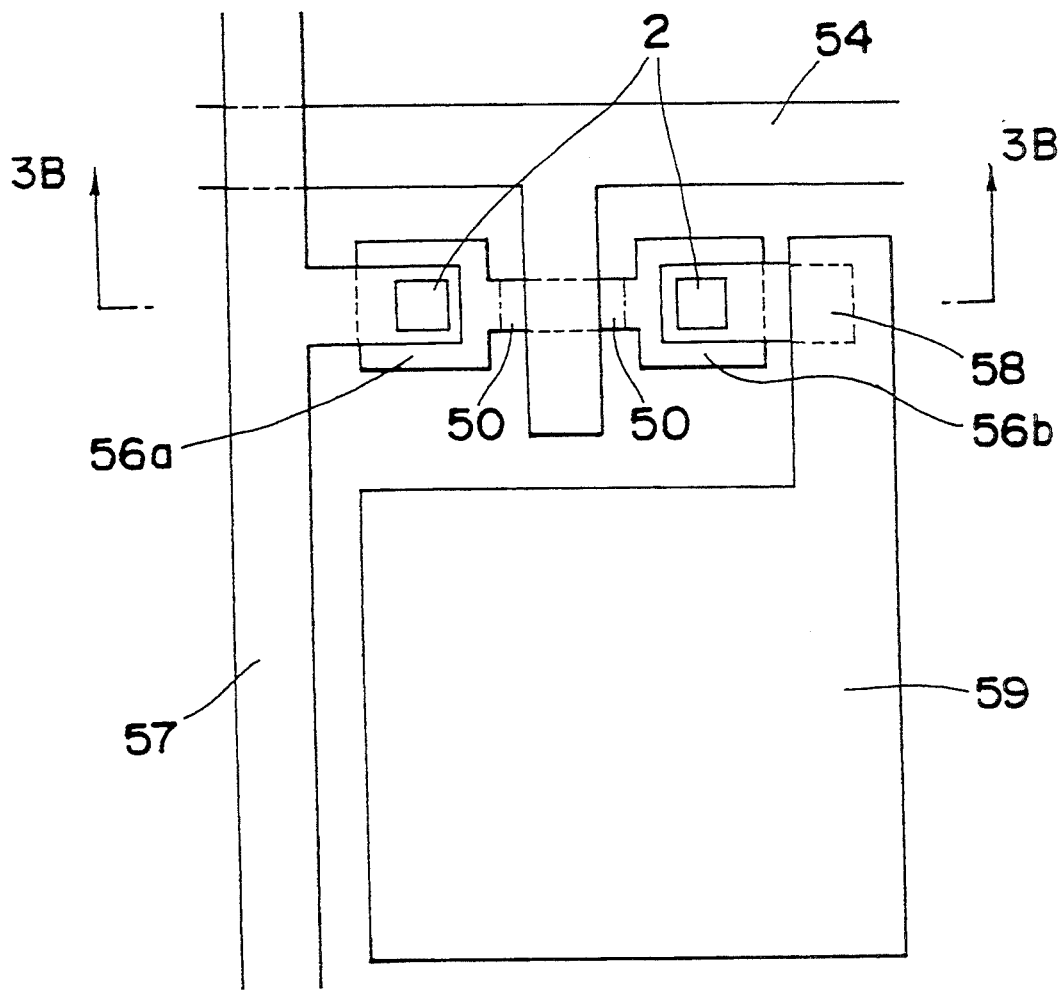
FIG. 3A is a plan view of a conventional thin-film transistor having an offset gate structure.
Figure 3B:
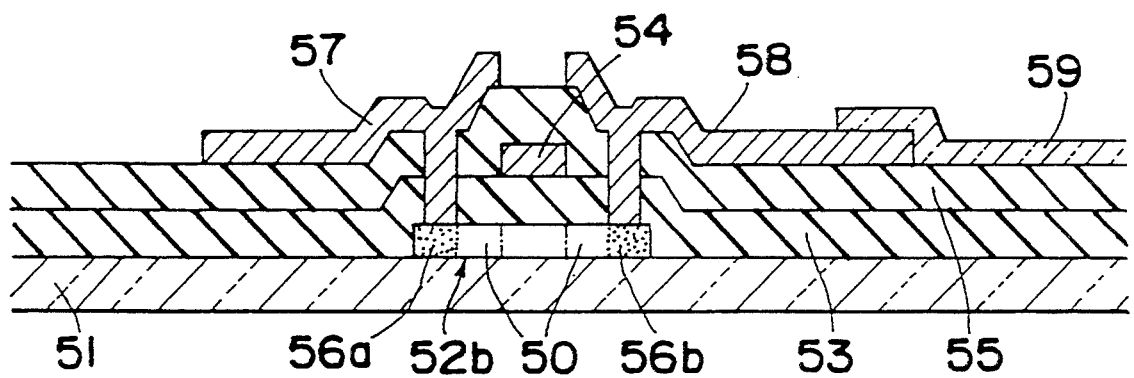
FIG. 3B is a cross sectional view taken along the line 3B–3B of FIG. 3A.
Figure 4A:
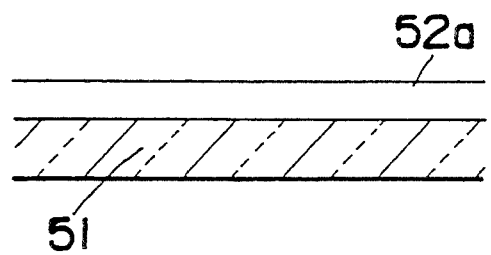
FIGS. 4A, 4B, 4C, 4D, 4E. 4F, 4G, 4H and 4I illustrate respective steps of a fabrication process for the thin-film transistor of FIGS. 3A and 3B.
Figure 4B:
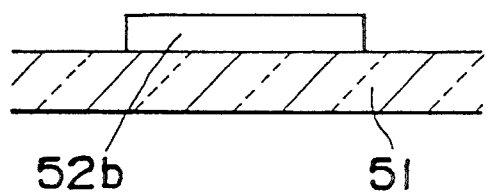
Figure 4C:
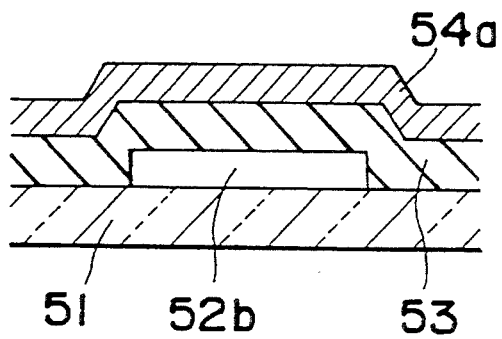
Figure 4D:
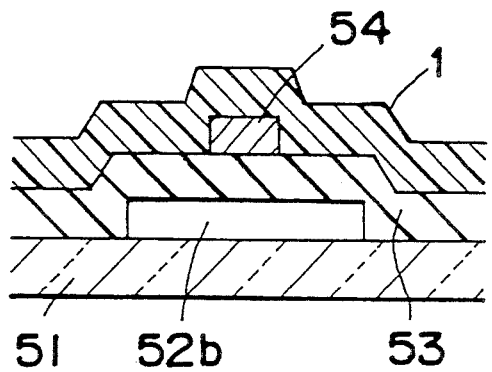
Figure 4E:
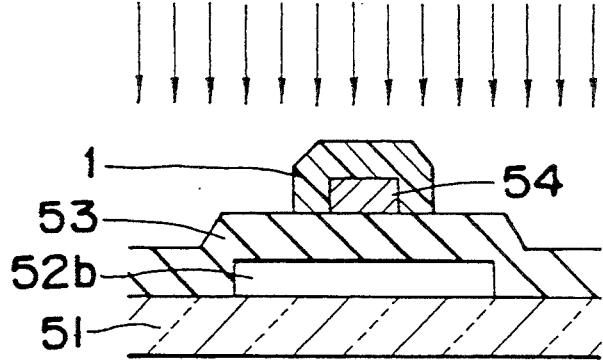
Figure 4F:
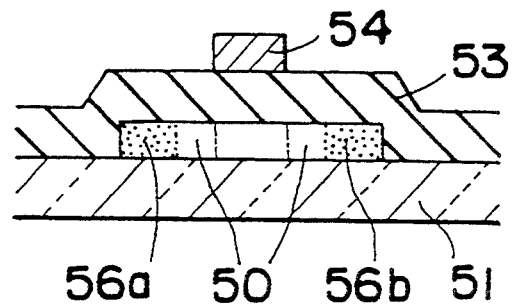
Figure 4G:
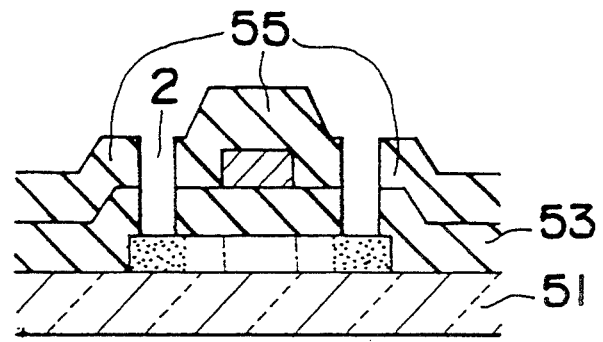
Figure 4H:
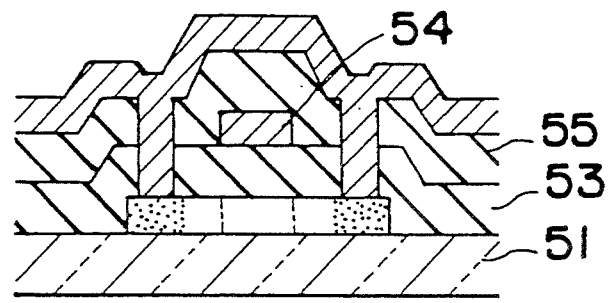
Figure 4I:
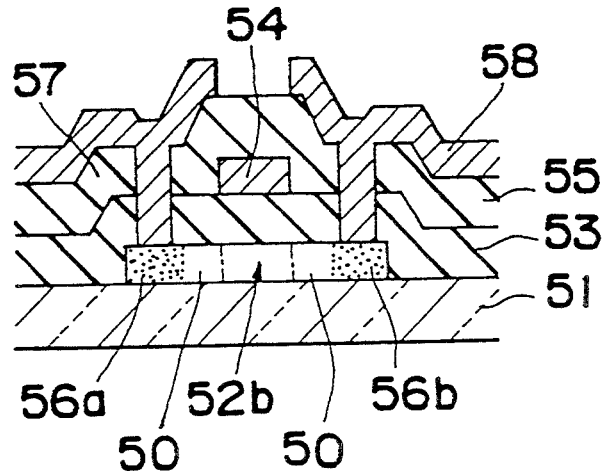
Figure 5:
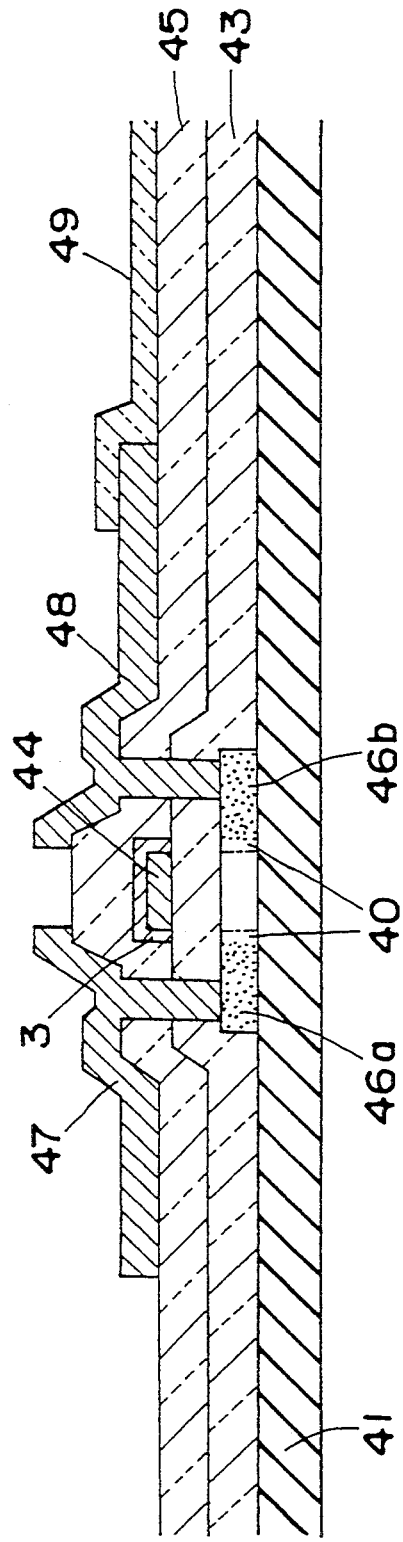
FIG. 5 is a sectional view of another conventional thin-film transistor having an offset gate structure.
Figure 6:
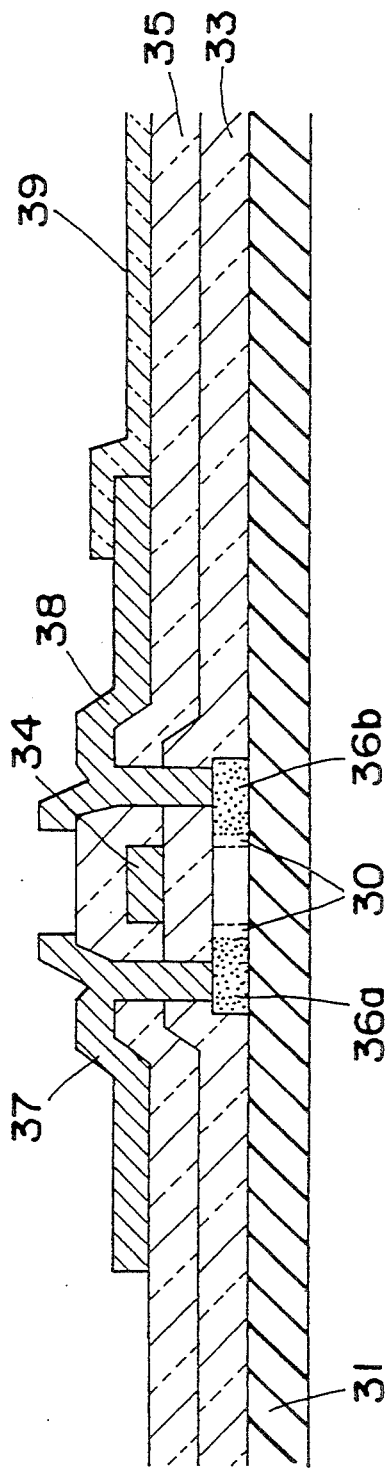
FIG. 6 is a sectional view of a further conventional thin-film transistor having an offset gate structure.
Figure 8A:
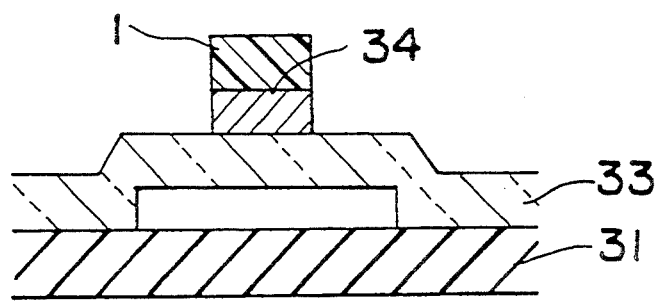
FIGS. 8A, 8B, 8C, 8D and 8E illustrate some steps of a fabrication process for the thin-film transistor of FIG. 6.
Figure 8B:
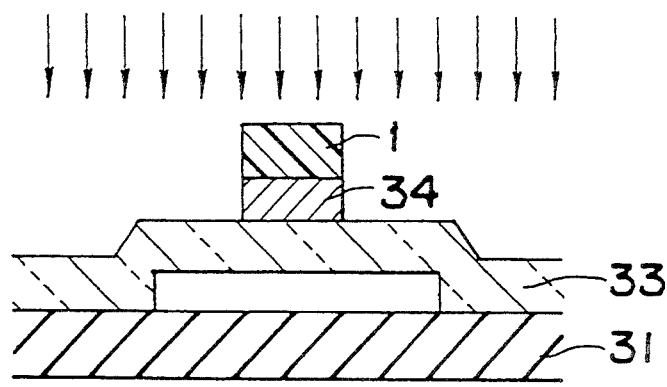
Figure 8C:
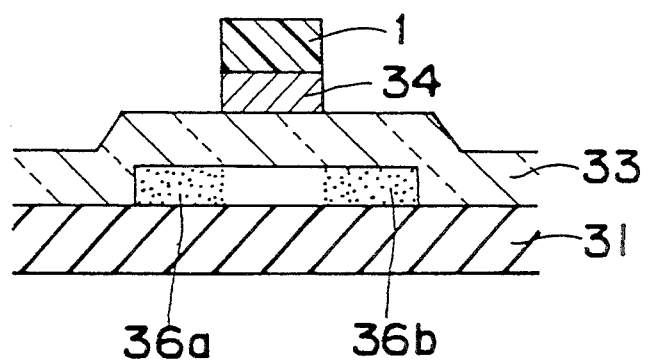
Figure 8D:
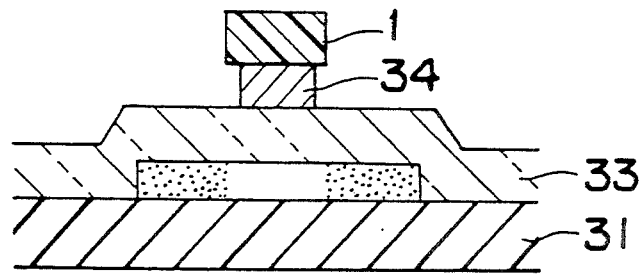
Figure 8E:
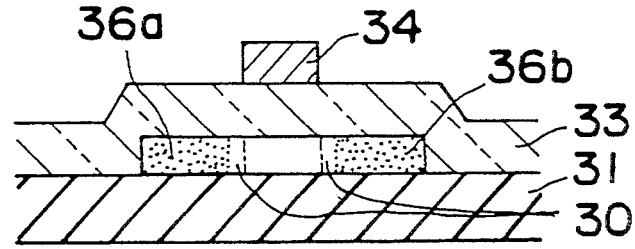
Figure 9A:
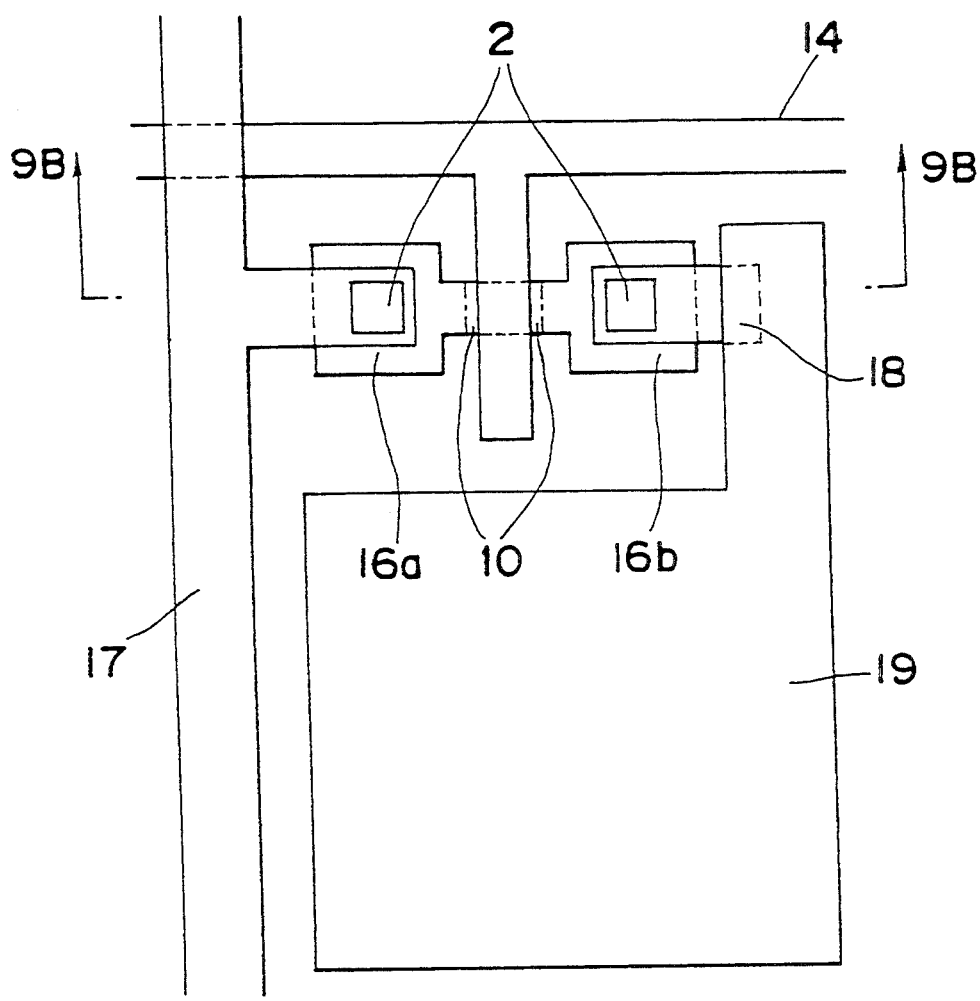
FIG. 9A is a plan view of a thin-film transistor having an offset gate structure fabricated by a fabrication process according to a first embodiment of the present invention.
Figure 9B:
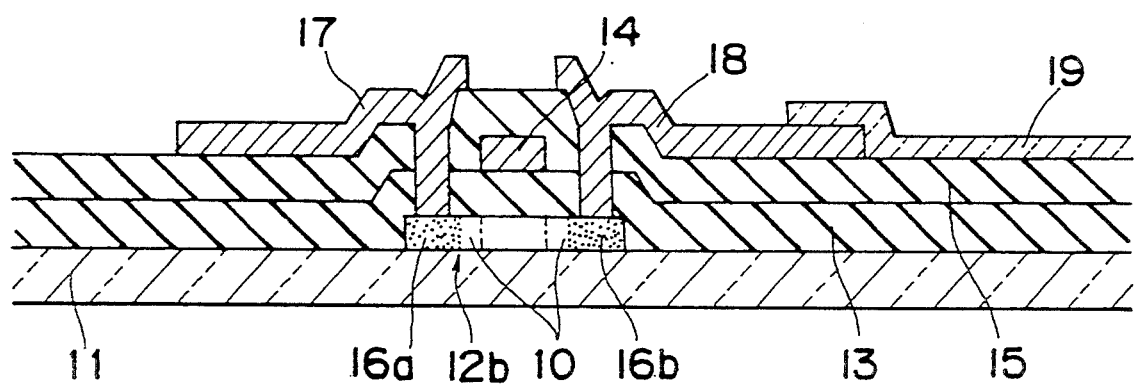
FIG. 9B is a cross sectional view taken along the line 9B–9B of FIG. 9A.

FIG. 9A is a plan view of a thin-film transistor fabricated by a fabrication process shown in FIGS. 10A–10J according to a first embodiment of the present invention, and FIG. 9B is a sectional view taken along the line 9B–9B of FIG. 9A. The following describes the fabrication process of the present embodiment with reference to these figures.

First, on a glass substrate 1 is formed an amorphous semiconductor (a-Si) film 12a, which is an intrinsic semiconductor film, having a film thickness of the order of 30–150 nm by the CVD, spattering, etc., as shown in FIG. 10A. A substrate formed with an insulation film on thereon may be used instead of the glass substrate.

Then, the amorphous semiconductor film 12a is patterned in a specified configuration and partially irradiated with the excimer laser, so that part of the amorphous semiconductor film 12a is made to grow into a polycrystalline semiconductor (P-Si) film 12b, as shown in FIG. 10B.

Thereafter, an insulation film (i.e., a gate insulation film) 13 of $SiO_2$ or another appropriate material is formed of the order of 100 nm in thickness by the TEOS (TetraEthyl OrthoSilicate) method, CVD method, spattering method, etc., as shown in FIG. 10C. Subsequently, a film having a film thickness of the order of 200 nm is formed as a gate electrode 14, using a conductive material such as, for example, Ta, Nb, Al or another metal, Si doped with an n-type or p-type impurity, or ITO. The film is patterned by photolithography or another method into a gate electrode 14. A width (i.e., a dimension between source and drain regions) of the gate electrode 14 obtained at this step is set to be larger than a design width of the gate electrode in a finally obtained thin-film transistor by widths of the offset regions which will be formed later.

Subsequently, using the gate electrode 14 as a mask, ions of a 5-valence element represented by phosphorus or ions of a 3-valence element represented by boron are doped into the polycrystalline semiconductor (P-Si) film 12b by the ion implantation method, as shown in FIG. 10D. The acceleration voltage used for the ion implantation is 10kV–70kV, and the ion dosage is $1 \times 10^{15}/cm^2 - 1 \times 10^{17}/cm^2$. As a result of the doping of the impurity ions, a source region 16a and a drain region 16b are formed. Subsequently, irradiation of the substrate with the excimer laser is performed to activate and thereby infuse the ions in the source and drain regions.

Figure 10F:
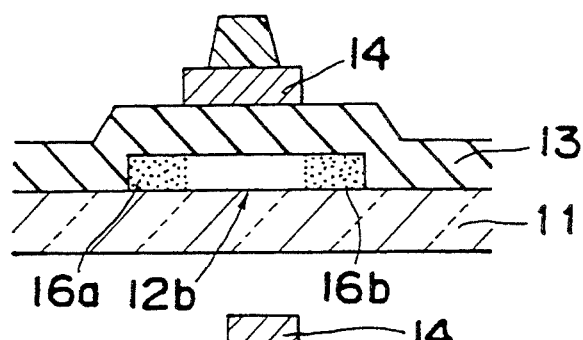

Next, the whole top surface of the substrate coated with a photoresist 1. The photoresist 1 is then exposed to light from the reverse side of the substrate, using the gate electrode 14 as a mask, as shown in FIG. 10E. At this time, a light exposure time is made longer than usual, for the purpose of making a pattern of the photoresist 1 narrower than the gate width as seen from FIG. 10F. As obvious, because the width of the photoresist 1 pattern can be changed as desired by controlling the light exposure time, the width of the gate electrode 14 is controllable. The photoresist pattern can be also controlled through control of the development time. The pattern of the gate electrode 14 can be also controlled by controlling the etching time as well.

Figure 10G:
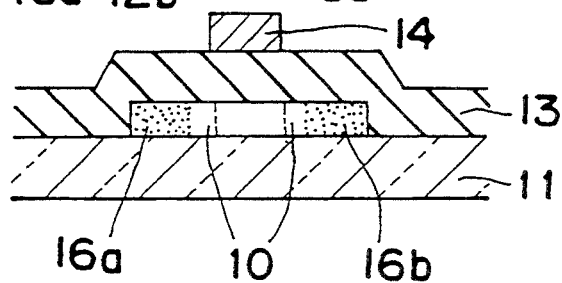

Next, the gate electrode 14 is again etched using the photoresist 1 pattern as a mask and is made narrower. As a result, offset regions 10 are formed, as shown in FIG. 10G. The gate electrode 14 is etched preferably about 0.5-2.0 micrometer, and more preferably about 1.0-1.5 micrometer, on each side. By so doing, a transistor with an excellent OFF characteristic and a high ON-current/OFF-current ratio.

Figure 10H:
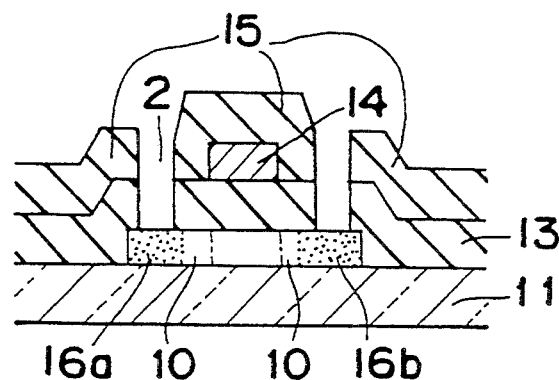

Subsequently, after removing the photoresist film 1, an insulation film 15 of SiNx, SiO2 or another appropriate material having a thickness of approx. 300-400 nm is formed on the entire substrate. Then, the insulation film 15 and the gate insulation film 13 are patterned together and contact holes 2 are thereby formed, as shown in FIG. 10H.

Figure 10I:
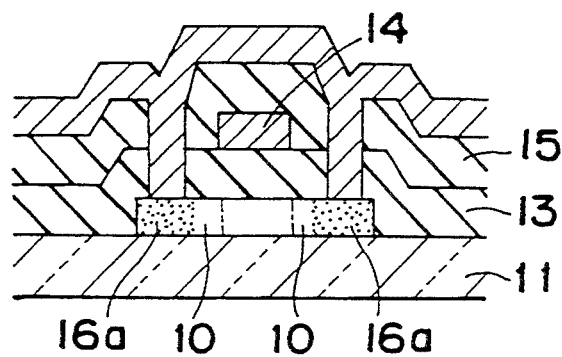
Figure 10J:
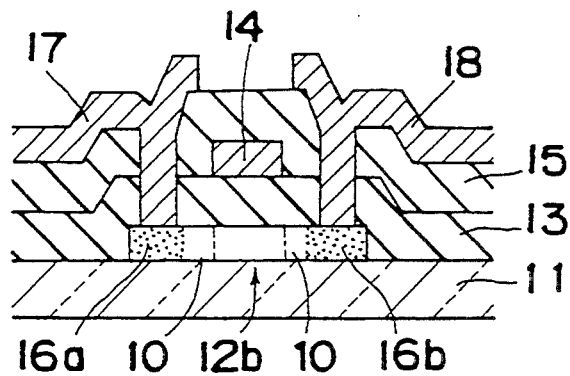

Next, a film of a metal material such as Al or Mo, or of a conductive material such as ITO is deposited approx. 500-600 nm in thickness, as shown in FIG. 10I. The film is then patterned in a specified .configuration into a source electrode 17 and drain electrode 18 as shown in FIG. 10J.

Finally, by forming a transparent conductive film such as an ITO film in a specified pattern which serves as a picture element electrode 19, the thin-film transistor shown in FIGS. 9A and 9B is completed.

Second embodiment

FIG. 11 is a cross sectional view of a thin-film transistor with an offset gate structure fabricated by a fabrication process shown in FIGS. 12A-12B according to a second embodiment of the present invention. The following describes the fabrication process of the present embodiment with reference to these figures.

Steps up to the step of forming offset regions 20 in the fabrication process in the second embodiment are the same as those in the fabrication process in the above-described first embodiment, and therefore description on those steps are omitted here.

After the offset regions 20 are formed, ion implantation of the same impurity as the impurity doped in the source region 26a and drain region 26b is performed at an acceleration voltage of 10-70 kV and at a low concentration of a dosage of $1 \times 10^{12}/cm^2$ to $1 \times 10^{15}/cm^2$. The ion implantation at a low concentration makes the offset regions 20 become LDD (Lightly Doped Drain) regions 4.

Subsequently, similar to the fabrication method of the first embodiment, after removing the photoresist film, an insulation film 25 of SiNx, SiO2 or another appropriate material having a thickness of approx. 300-400 nm is formed on the entire substrate. Then, the insulation film 25 and the gate insulation film 23 are patterned together and contact holes 2 are thereby formed. Thereafter, a film of a metal material such as Al or Mo, or of a conductive material such as ITO is deposited approx. 500-600 nm in thickness and then patterned in a specified configuration to form a source electrode 27 and drain electrode 28. Finally, by forming a transparent conductive film such as an ITO film in a specified pattern which serves as a picture element electrode 29, the thin-film transistor shown in FIG. 11 is completed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a transistor having an offset gate structure wherein offset regions are formed between a gate electrode and a source region and between the gate electrode and a drain region, comprising the steps of:

forming a semiconductor film, a gate insulation film and a gate electrode in that order on a top surface of a substrate either formed of an insulating material or having an insulation film on a surface thereof;

doping impurity ions in said semiconductor film using said gate electrode as a mask and thereby forming a source region and a drain region in the semiconductor film;

forming a photoresist film on said gate electrode and gate insulation film;

exposing said photoresist film to light from a back side of said substrate to form a photoresist pattern of a width smaller than that of said gate electrode; and etching both side surfaces of said gate electrode using said photoresist pattern as a mask and thereby forming an offset region of a specified width between said gate electrode and each of said source and drain regions.

2. The transistor fabrication method as claimed in claim 1, wherein said semiconductor film is an intrinsic semiconductor film.

3. The transistor fabrication method as claimed in claim 1, controlling the width of said offset region by controlling a light exposure time for said photoresist film.

4. The transistor fabrication method as claimed in claim 1, controlling the width of said offset region by controlling a development time for said photoresist film.

5. The transistor fabrication method as claimed in claim 1, controlling the width of said offset region by controlling an etching time for said gate electrode.

6. The transistor fabrication method as claimed in claim 1, further comprising the step of:

doping impurity ions in said semiconductor film at a concentration lower than a concentration of the impurity ions doped in said source and drain regions using said gate electrode as a mask after the step of forming said offset regions.

* * * * *